United States Patent
Chiang et al.

(10) Patent No.: US 9,184,187 B2
(45) Date of Patent: Nov. 10, 2015

(54) THIN FILM TRANSISTOR ARRAY MANUFACTURING METHOD

(71) Applicant: Shenzhen China Star Optoelectronics Technology Co., Ltd., Shenzhen (CN)

(72) Inventors: Cheng-Lung Chiang, Shenzhen (CN); Po-Lin Chen, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 13/805,673

(22) PCT Filed: Nov. 9, 2012

(86) PCT No.: PCT/CN2012/084358
§ 371 (c)(1),
(2) Date: Dec. 20, 2012

(87) PCT Pub. No.: WO2014/059713
PCT Pub. Date: Apr. 24, 2014

(65) Prior Publication Data
US 2015/0214257 A1    Jul. 30, 2015

(30) Foreign Application Priority Data

Oct. 19, 2012    (CN) .......................... 2012 1 0401021

(51) Int. Cl.
*H01L 21/335* (2006.01)
*H01L 21/8232* (2006.01)
(Continued)

(52) U.S. Cl.
CPC ........ *H01L 27/1259* (2013.01); *H01L 21/0217* (2013.01); *H01L 21/02164* (2013.01); *H01L 21/02565* (2013.01); *H01L 21/441* (2013.01); *H01L 21/47573* (2013.01); *H01L 27/1225* (2013.01); *H01L 27/1288* (2013.01);
(Continued)

(58) Field of Classification Search
CPC .... H01L 27/04; H01L 21/82; G02F 1/133345
USPC ............................................ 438/155; 349/39
See application file for complete search history.

(56) References Cited

U.S. PATENT DOCUMENTS 5,355,002 A * 10/1994 Wu ................................. 257/57
5,650,358 A *  7/1997 Gu et al. ........................ 438/30
(Continued)

FOREIGN PATENT DOCUMENTS

WO    WO2012029644    *  3/2012    ............ H01L 21/336
WO    WO2012046658    *  4/2012    ............ H01L 21/336

*Primary Examiner* — Caridad Everhart
(74) *Attorney, Agent, or Firm* — Mark M. Friedman (57) ABSTRACT

A TFT array manufacturing method is disclosed herein and includes steps: forming a first metal layer on a substrate; depositing a first insulating layer to cover the first metal layer; forming an oxide semiconductor layer on the first insulating layer in a TFT area; forming a second insulating layer on the first insulating layer and the oxide semiconductor layer; etching the second insulating layer in the TFT area to expose the oxide semiconductor layer and etching the second insulating layer and the first insulating layer in a signal wire area simultaneously to expose the first metal layer; and forming a second metal layer on the second insulating layer of the TFT area, and the second metal layer being connected the oxide semiconductor layer, and forming the second metal layer on the first metal layer of the signal wire area to contact the first metal, layer.

11 Claims, 6 Drawing Sheets

(51) Int. Cl.
    H01L 27/12       (2006.01)
    H01L 29/786      (2006.01)
    H01L 21/02       (2006.01)
    H01L 21/441      (2006.01)
    H01L 21/4757     (2006.01)
    H01L 29/24       (2006.01)
    H01L 29/45       (2006.01)
    H01L 29/49       (2006.01)
    H01L 29/66       (2006.01)
(52) U.S. Cl.
    CPC ............... *H01L29/24* (2013.01); *H01L 29/45*
    (2013.01); *H01L 29/4908* (2013.01); *H01L 29/66969* (2013.01); *H01L 29/7869* (2013.01)

(56) References Cited

U.S. PATENT DOCUMENTS

| | | | |
|---|---|---|---|
| 5,731,856 A * | 3/1998 | Kim et al. ....................... | 349/43 |
| 2002/0048866 A1* | 4/2002 | Wong ............................. | 438/155 |
| 2013/0153904 A1* | 6/2013 | Nishimura et al. ............. | 257/57 |
| 2013/0181217 A1* | 7/2013 | Hara et al. ...................... | 257/43 |

* cited by examiner

THIN FILM TRANSISTOR ARRAY MANUFACTURING METHOD

FIELD OF THE INVENTION

The present invention relates to a field of a thin field transistor (TFT) array, and more particularly to a TFT array manufacturing method for reducing a signal wire resistance of the TFT without adding extra processing steps.

BACKGROUND OF THE INVENTION

For the past few years, instead of using a silicon channel in a conventional thin film transistor (TFT), an oxide semiconductor which is utilized in the TFT is another option. Because the oxide semiconductor TFT has an electrical characteristic of high carrier mobility as a low-temperature poly-silicon semiconductor TFT and an electrical uniformity as an amorphous silicon semiconductor TFT, the active matrix flat panel display in which the oxide semiconductor TFTs are applied gradually becomes a mainstream technique in the market.

Generally, at least six mask processes are required to produce a TFT which utilizes oxide semiconductors (such as indium gallium zinc oxide semiconductor, and so on). In a conventional TFT array, it is required to add a mask to form a connective hole in an insulating layer between the metal layers, so that a double-metal design in which a metal layer is directly stacked on another metal layer is formed.

Figure 1A:
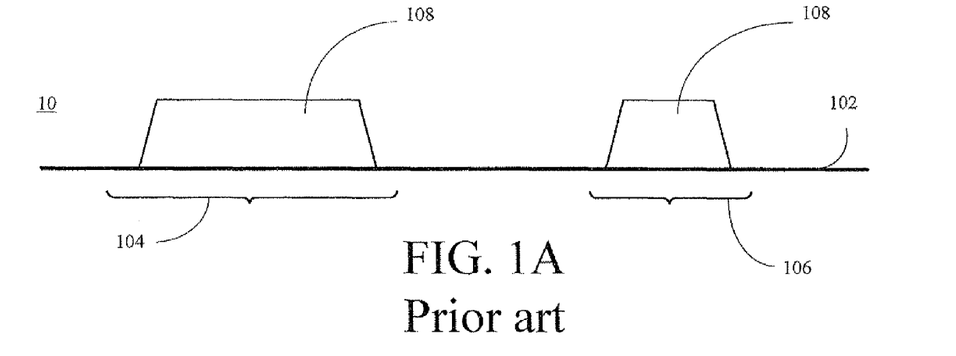
FIG. 1A~FIG. 1G are sectional structure views illustrating a conventional thin film transistor (TFT) array.
Figure 1B:
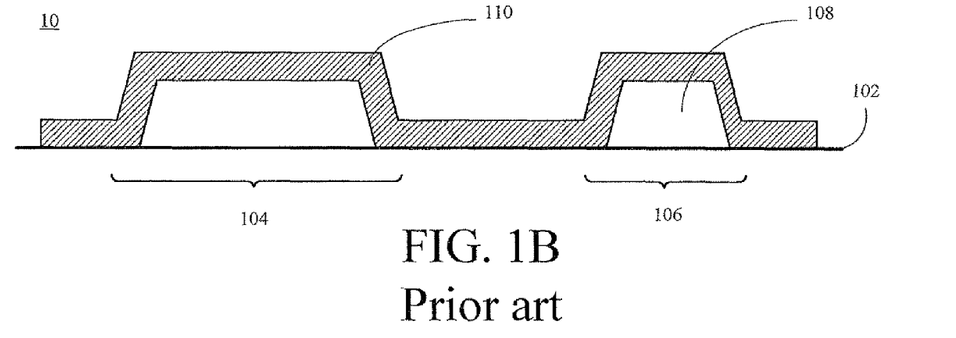
Figure 1C:
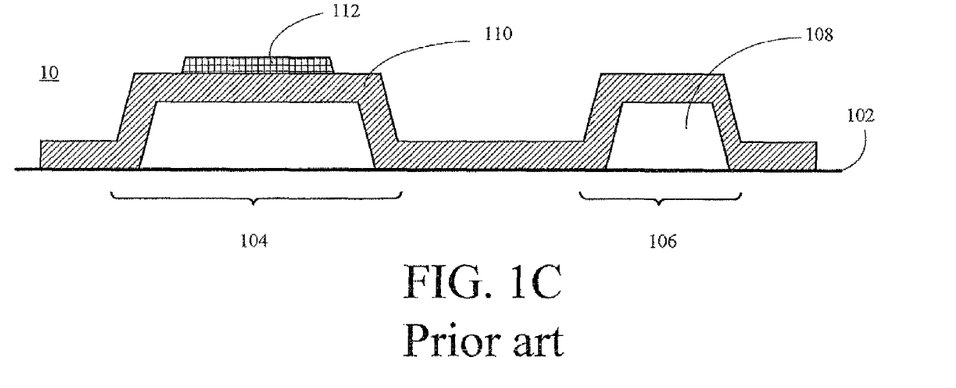
Figure 1D:
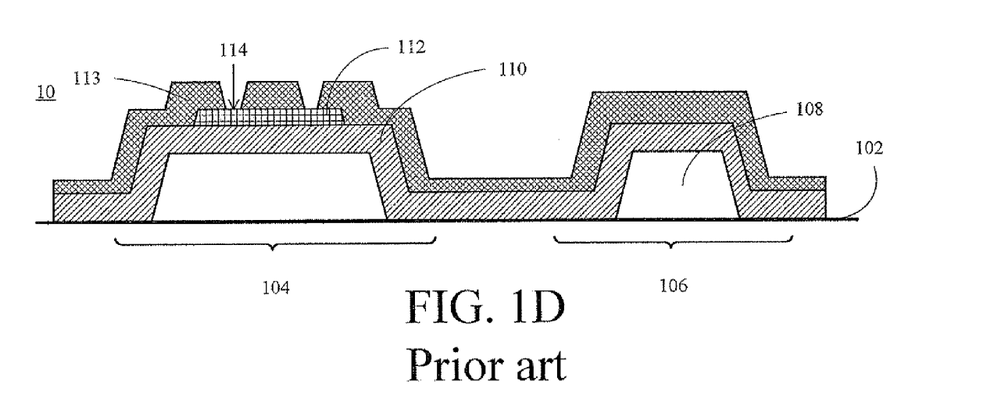
Figure 1E:
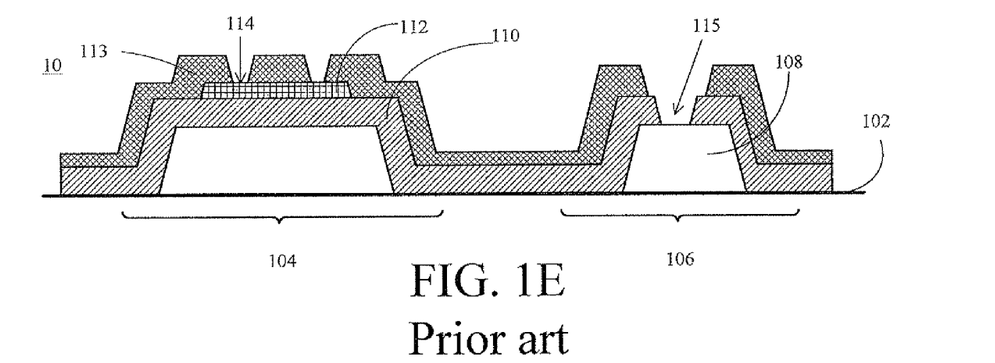

FIG. 1A~FIG. 1G are sectional structure views illustrating a conventional TFT array. As shown in FIG. 1A, a substrate 102 of the TFT array 10 can be divided into a TFT area 104 and a signal wire (scanning wire or data wire) area 106. A patterned first metal layer 108 is formed in the TFT area 104 and the signal wire area 106 of the substrate 102. The patterned first metal layer 108 in the TFT area 104 is used as a gate electrode of the TFT and the patterned first metal layer 108 in the signal wire area 106 is used as a metal conductive wire for signal transmitting. Then, as shown in FIG. 1B, a first insulating layer 110 is formed to cover the patterned first metal layer 108 in the TFT area 104 and the signal wire area 106 respectively. Thereafter, an oxide semiconductor layer 112 is formed on the first insulating layer 110 of the TFT area 104, as shown in FIG. 1C. Then, as shown in FIG. 1D, a second insulating layer 113 is formed on the oxide semiconductor layer 112 and the first insulating layer 110 and the second insulating layer 113 in the TFT area 104 is etched to expose a portion of the oxide semiconductor layer 112 to be several connective points 114 for source electrode and drain electrode. Furthermore, in the next process step, the first insulating layer 110 and the second insulating layer 113 in the signal wire area 106 are etched to expose a portion of the first metal layer 108 to be a connective hole 115, as shown in FIG. 1E.

Figure 1F:
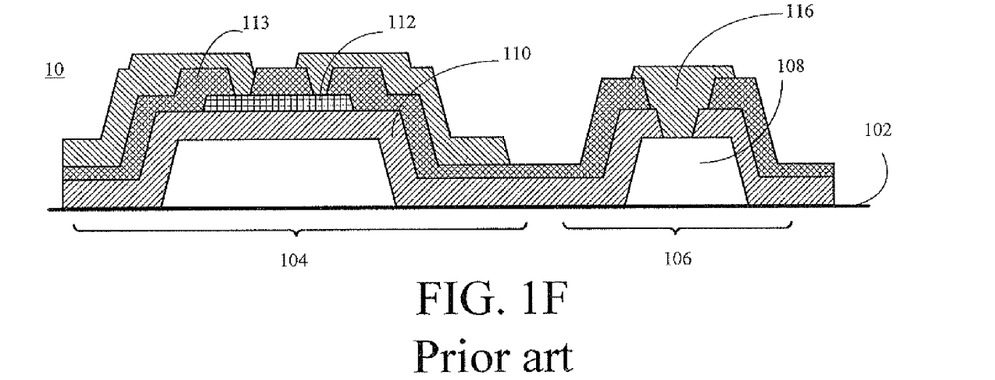
Figure 1G:
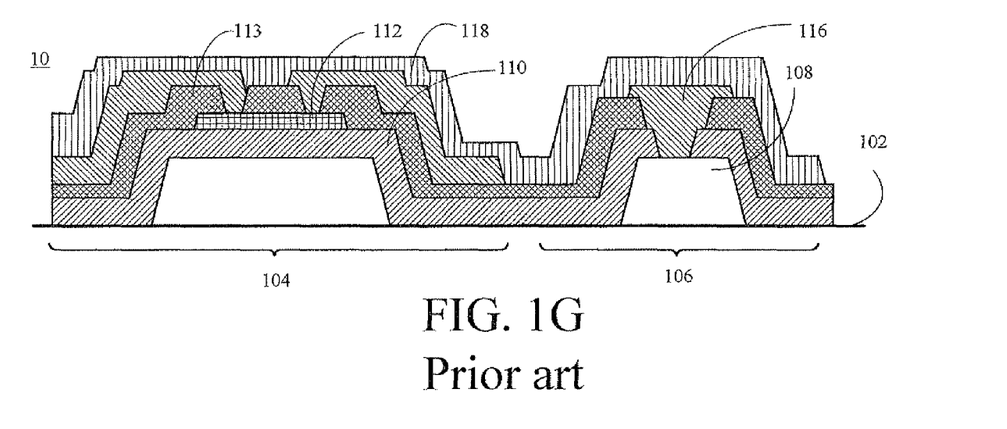

Subsequently, as shown in FIG. 1F, a patterned second metal layer 116 is formed on the second insulating layer 113, the exposed oxide semiconductor layer 112 and the exposed first metal layer 108, and the second metal layer 116 is directly and electrically connected with the first metal layer 108 in the signal wire area 106. By the direct connection of the second metal layer 116 and the first metal layer 108 in the signal wire area 106, a double-metal layer structure is formed to reduce the wire resistance in the signal wire area 106. Finally, as shown in FIG. 1G, a passivation (PV) layer 118 is formed on the second metal layer 116. According to the conventional semiconductor process steps shown in FIG. 1A~FIG. 1G, it is required to add the extra process step shown in FIG. 1E and the manufacturing cost is increase as a result.

Therefore, a need is arisen to achieve the purpose to reduce the resistance of the signal wire without adding an extra mask as well as without increasing additional manufacturing cost in the TFT array manufacturing process.

SUMMARY OF THE INVENTION

An object of the present invention is to provide a thin film transistor (TFT) array manufacturing method to reduce a resistance of a signal wire without adding additional process step.

For achieving the above-mentioned object, the present invention proposes a thin film transistor (TFT) array manufacturing method and the manufacturing method includes steps of: forming a patterned first metal layer on a substrate; depositing a first insulating layer to cover the patterned first metal layer; forming an oxide semiconductor layer on the first insulating layer in a TFT area; forming a second insulating layer on the first insulating layer and the oxide semiconductor layer; etching the second insulating layer in the TFT area to expose a portion of the oxide semiconductor layer and etching the second insulating layer and the first insulating layer in a signal wire area at the same time to expose a portion of the patterned first metal layer; and forming a patterned second metal layer on the second insulating layer of the TFT area, and the patterned second metal layer being connected with the oxide semiconductor layer, and forming the patterned second metal layer on the patterned first metal layer of the signal wire area to contact the first metal layer.

Another object of the present invention is to provide a TFT array structure to include a double-metal layer structure to reduce the signal wire resistance of the TFT.

For achieving the above-mentioned object, the present invention proposes a TFT array manufacturing method and the manufacturing method includes steps of respectively forming a patterned first metal layer on a TFT area and a signal wire area of a substrate, the patterned first metal layer on the TFT area being a gate electrode and the patterned first metal layer on the signal wire area being a metal conductive wire; depositing a first insulating layer to cover the patterned first metal layer; forming an oxide semiconductor layer on the first insulating layer of the TFT area; forming a second insulating layer on the first insulating layer and the oxide semiconductor layer; etching the second insulating layer in the TFT area to expose a portion of the oxide semiconductor layer and etching the second insulating layer and the first insulating layer in the signal wire area at the same time to expose a portion of the patterned first metal layer; forming a patterned second metal layer on the second insulating layer of the TFT area to be a source electrode and a drain electrode and the patterned second metal layer is connected with the oxide semiconductor layer, and simultaneously forming the patterned second metal layer on the patterned first metal layer of the signal wire area and the patterned first metal layer and the patterned second metal layer are formed a double-metal layer; and depositing a passivation layer on the patterned second metal and the second insulating layer.

The above-mentioned description of the present invention can be best understood by referring to the following detailed description of the preferred embodiments and the accompanying drawings.

DETAILED DESCRIPTION OF THE PREFERRED EMBODIMENTS

In the following detailed description of the preferred embodiments, reference is made to the accompanying drawings which form a part hereof, and as shown by way of illustration specific embodiments in which the invention may be practiced. In this regard, directional terminology, such as "top," "bottom," "front," "back," "left," "right," "inside," "outside," "side," etc., is used with reference to the orientation of the Figure(s) being described. As such, the directional terminology is used for purposes of illustration and is in no way limiting the present invention.

Figure 2A:
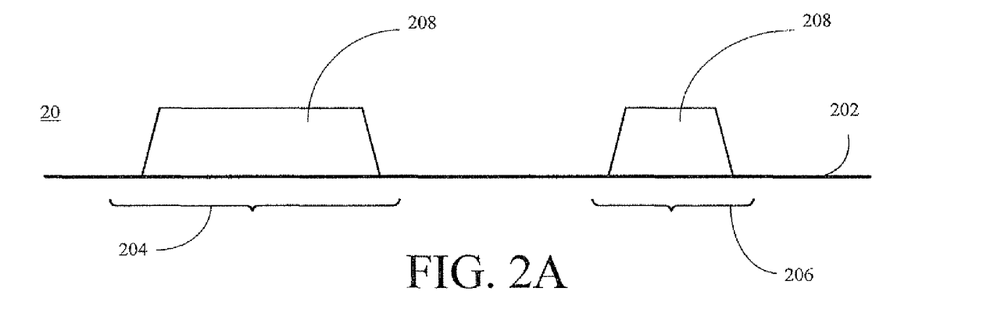
FIG. 2A~FIG. 2F are sectional structure views illustrating a TFT array in a preferred embodiment of the present invention.
Figure 2B:
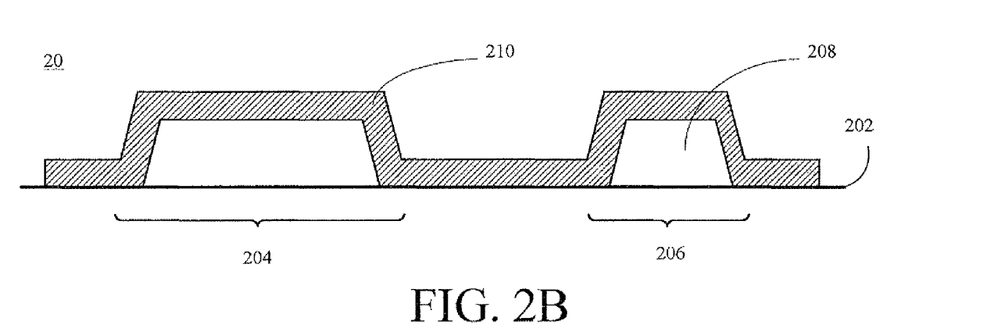
Figure 2C:
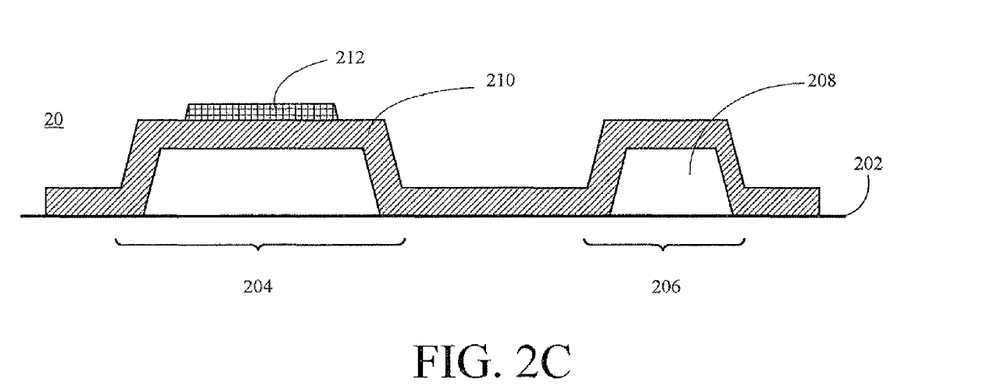
Figure 2D:
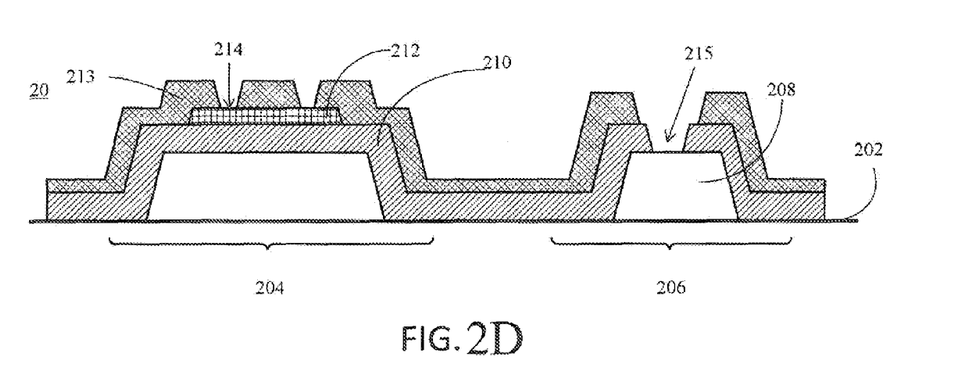

FIG. 2A~2F are sectional structure views illustrating a thin film transistor (TFT) array in a preferred embodiment of the present invention. As shown in FIG. 2A, a substrate 202 in the TFT array 20 of the present invention can be divided into a TFT area 204 and a signal wire (such as a scanning wire or a data wire) area 206. A first metal layer 208 is formed on the substrate 202 of the TFT array 20 and etched to reserve the patterned first metal layer 208 in the TFT area 204 and the signal wire area 206. The patterned first metal layer 208 in the TFT area is used to be a gate electrode of the TFT and the patterned first metal layer 208 in the signal wire area 206 is used to be a metal conductive wire for signal transmitting. Thereafter, as shown in FIG. 2B, a first insulating layer 210 is formed on the patterned first metal layer 208 and the substrate 202 and the first insulating layer 210 covers the patterned first metal layer 208 in the TFT area 204 and the signal wire area 206 respectively. In addition, as shown in FIG. 2C, an oxide semiconductor layer 212 is further formed on the first insulating layer 210 in the TFT area 204 and the oxide semiconductor layer 212 is preferably made of indium gallium zinc oxide (IGZO). In a different embodiment, the oxide semiconductor layer 212 can be made of other metal oxides, such as zinc (Zn), tin (Sn), indium (In) and gallium (Ga), but it is not limited herein. Thereafter, as shown in FIG. 2D, a second insulating layer 213 is formed on the oxide semiconductor layer 212 and the first insulating layer 210 and the second insulating layer 213 in the TFT area 204 is etched to expose a portion of the oxide semiconductor layer 212 to form several connective points 214. Similarly, in the same etching step, the first insulating layer 210 and the second insulating layer 213 in the signal wire area 206 are etched to expose a portion of the first metal layer 208 to form a connective hole 215. The material of the first insulating layer 210 and the second insulating layer 213 is selected from at least one of silicon oxide (SiOx), silicon nitride (SiNx) and silicon oxynitride (SiNxOy).

Figure 2E:
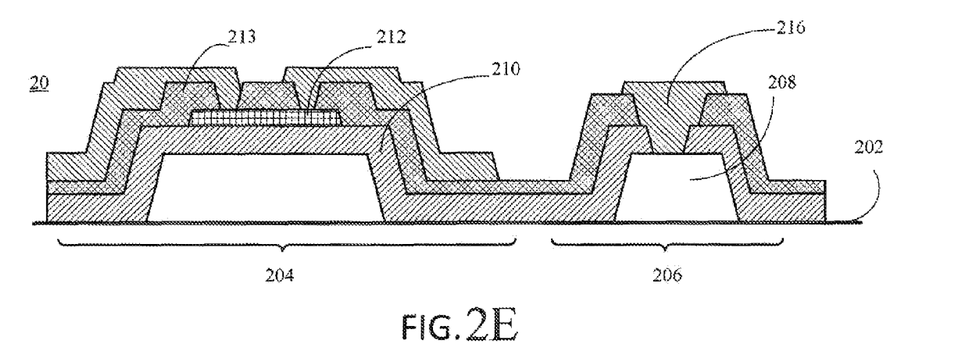
Figure 2F:
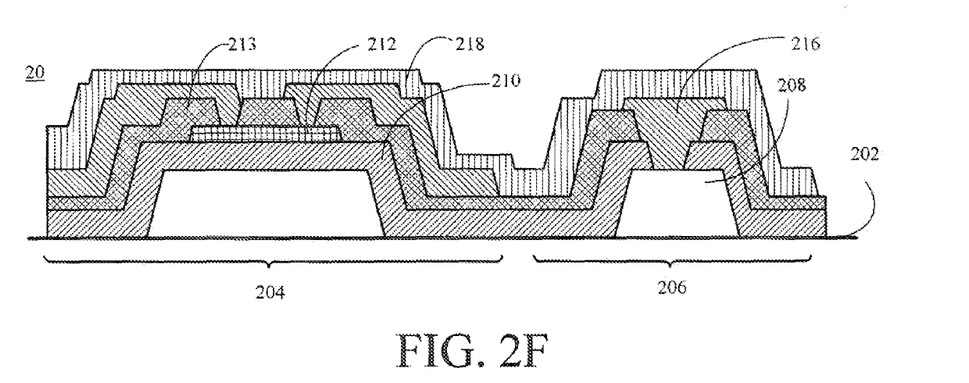

Now, as shown in FIG. 2E, a patterned second metal layer 216 is formed on the second insulating layer 213, the exposed oxide semiconductor layer 212 and the exposed first metal layer 208. The patterned second metal layer 216 in the TFT area 204 is electrically connected with the oxide semiconductor layer 212 and used as a source electrode and a drain electrode of the TFT. The second metal layer 216 in the signal wire area 206 is directly and electrically connected with the first metal layer 208. According to the direct connection of the first metal layer 208 and the second metal layer 216 in the signal wire area 206, the first metal layer 208 and the second metal layer 216 are formed to be a double-metal layer structure to reduce the wire resistance in the signal wire area 206. At final, as shown in FIG. 2F, a passivation layer 218 is formed on the second metal layer 216. By the semiconductor process steps in FIG. 2A~FIG. 2F, the double-metal layer structure is formed in the signal wire area 206 to reduce the wire resistance of the signal wire area 206 without adding extra process steps. The double-metal layer formed by the first metal layer 208 and the second metal layer 216 is preferably made of metal components selected from at least two of aluminum (Al), copper (Cu), a molybdenum (Mo) or titanium (Ti).

Figure 3:
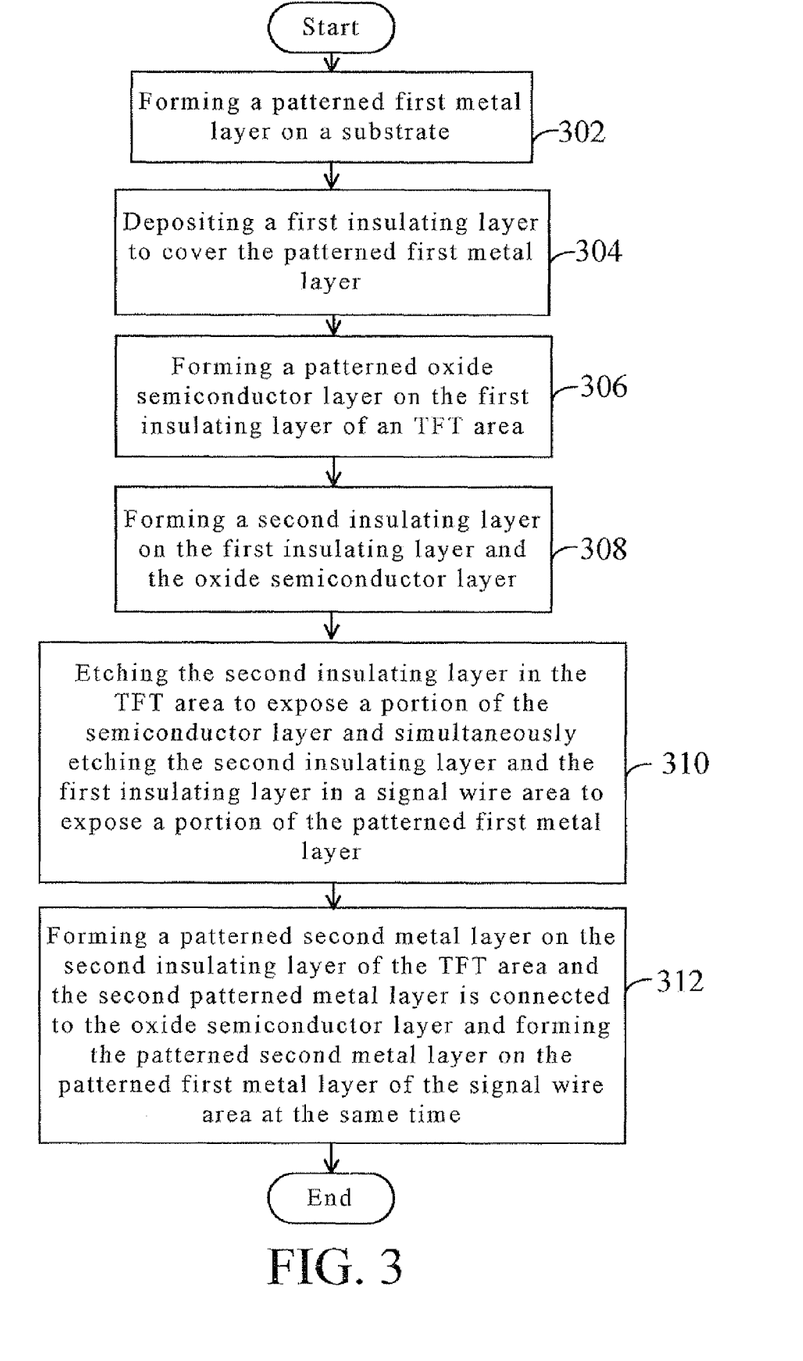
FIG. 3 is a flowchart illustrating the TFT array manufacturing method in the preferred embodiment of the present invention.

FIG. 3 is a flowchart illustrating the TFT array manufacturing method in the preferred embodiment of the present invention. As shown in FIG. 3, the description is described in accordance with the TFT array structure shown in FIG. 2A~FIG. 2F. In step 302, a first metal layer 208 is coated on a substrate 202 of a TFT array 20 and the first metal layer 208 is etched to form the patterned first metal layer 208. The patterned first metal layer 208 is formed to be a gate electrode in the TFT area 204 and a metal conductive wire in the signal wire area 206 of the substrate 202 respectively. The first metal layer 208 is preferably made of aluminum (Al), copper (Cu), molybdenum (Mo) and titanium (Ti). In step 304, the first insulating layer 210 is formed to cover the patterned first metal layer 208. In step 306, a patterned oxide semiconductor layer 212 is formed on the first insulating layer 210 in the TFT area 204. In the embodiment of the present invention, the oxide semiconductor layer 212 is preferably made of indium gallium zinc oxide (IGZO). However, in a different embodiment, the oxide semiconductor layer 212 is a metal oxide selected from zinc (Zn), tin (Sn), indium (In) and gallium (Ga), but it is not limited herein. In step 308, a second insulating layer 213 is formed on the first insulating layer 210 and the oxide semiconductor layer 212 and the second insulating layer 213 in the TFT area 204 is etched to expose a portion of the oxide semiconductor layer 212 in the TFT area 204 to form several connective points 214 for source electrode and drain electrode. Simultaneously, the second insulating layer 213 and the first insulating layer 210 in the signal wire area 206 are etched to expose a portion of the first metal layer 208 in the signal wire area 206. Therefore, a through hole is formed in the signal wire area 206. By passing through the through hole, the exposed first metal layer 208 is used as a connective hole 215. Thereafter, in step 310, a patterned second metal layer 216 is formed and the patterned second metal layer 216 is electrically connected with the oxide semiconductor layer 212 by the connective points and the patterned second metal layer 216 is used as source electrode and drain electrode. Simultaneously, the second metal layer 216 is connected with the first metal layer 208 to be utilized as a double-metal layer in the connective hole 215 by passing through the through hole. Similarly, the second metal layer 216 is preferably made of aluminum (Al), copper (Cu), a molybdenum (Mo) or titanium (Ti). At final, in step 312, a passivation layer 218 is deposited on the second metal layer 216 and the second insulating layer 213.

As described above, the present invention has been described with preferred embodiments thereof and it is understood that many changes and modifications to the described embodiments can be carried out without departing from the scope and the spirit of the invention that is intended to be limited only by the appended claims.

What is claimed is:

1. A thin film transistor (TFT) array manufacturing method, comprising steps of:

forming a patterned first metal layer on a substrate;

depositing a first insulating layer to cover the patterned first metal layer;

forming an oxide semiconductor layer on the first insulating layer in a TFT area;

forming a second insulating layer on the first insulating layer and the oxide semiconductor layer;

etching the second insulating layer in the TFT area to expose a portion of the oxide semiconductor layer and etching the second insulating layer and the first insulating layer in a signal wire area at the same time to expose a portion of the patterned first metal layer; and forming a patterned second metal layer on the second insulating layer of the TFT area, and the patterned second metal layer being connected with the oxide semiconductor layer, and forming the patterned second metal layer on the patterned first metal layer of the signal wire area to contact the first metal layer;

wherein, in the signal wire area, the first insulating layer has a first hole diameter, and the second insulating layer has a second hole diameter, and the second hole diameter is greater than the first hole diameter.

2. The TFT array manufacturing method according to claim 1, wherein the oxide semiconductor layer comprises a material of a metal oxide selected from the group consisting of zinc (Zn), tin (Sn), indium an) and gallium (Ga).

3. The TFT array manufacturing method according to claim 1, wherein a material of the patterned first metal layer is different from the material of the patterned second metal layer.

4. The TFT array manufacturing method according to claim 1, wherein the patterned first metal layer and the patterned second metal layer comprise materials selected from the group consisting of aluminum (Al), copper (Cu), molybdenum (Mo) and titanium (Ti).

5. The TFT array manufacturing method according to claim 1, wherein the first insulating layer and the second insulating layer comprise materials selected from the group consisting of SiOx, SiNx and SiOxOy.

6. The TFT array manufacturing method according to claim 1, wherein the step of etching the second insulating layer and the first insulating layer of the signal wire area to expose a portion of the patterned first metal layer is to form a connective hole.

7. The TFT array manufacturing method according to claim 6, wherein the patterned second metal layer is filled within the connective hole to contact the patterned first metal layer.

8. A thin film transistor (TFT) array manufacturing method comprises steps of:

respectively forming a patterned first metal layer on a TFT area and a signal wire area of a substrate, the patterned first metal layer on the TFT area being a gate electrode and the patterned first metal layer on the signal wire area being a metal conductive wire;

depositing a first insulating layer to cover the patterned first metal layer;

forming an oxide semiconductor layer on the first insulating layer of the TFT area;

forming a second insulating layer on the first insulating layer and the oxide semiconductor layer;

etching the second insulating layer in the TFT area to expose a portion of the oxide semiconductor layer and etching the second insulating layer and the first insulating layer in the signal wire area at the same time to expose a portion of the patterned first metal layer;

forming a patterned second metal layer on the second insulating layer of the TFT area to be a source electrode and a drain electrode, the patterned second metal layer being connected with the oxide semiconductor layer, and simultaneously forming the patterned second metal layer on the patterned first metal layer of the signal wire area and the patterned first metal layer and the patterned second metal layer being formed as a double-metal layer; and depositing a passivation (PV) layer on the patterned second metal and the second insulating layer;

wherein, in the signal wire area, the first insulating layer has a first hole diameter, and the second insulating layer has a second hole diameter, and the second hole diameter is greater than the first hole diameter.

9. The TFT array manufacturing method according to claim 8, wherein the oxide semiconductor layer comprises a material of a metal oxide selected from the group consisting of zinc (Zn), tin (Sn), indium (In) and gallium (Ga).

10. The TFT array manufacturing method according to claim 8, wherein the patterned first metal layer and the patterned second metal layer comprise materials selected from the group consisting of aluminum (Al), copper (Cu), molybdenum (Mo) and titanium (Ti).

11. The TFT array manufacturing method according to claim 8, wherein the first insulating layer and the second insulating layer comprise materials selected from the group consisting of SiOx, SiNx and SiOxOy.

* * * * *